United States Patent [19]
Shiue et al.

[11] Patent Number: 5,917,351
[45] Date of Patent: Jun. 29, 1999

[54] RELAY-RACE FLL/PLL HIGH-SPEED TIMING ACQUISITION DEVICE

[75] Inventors: Muh-Tian Shiue, Taichung Hsien; Chorng-Kuang Wang, Taipei; Kuang-Hu Huang, Taoyuan Hsien; Po-Chiun Huang, Hsin-tein, all of Taiwan

[73] Assignee: National Science Council, Taipei, Taiwan

[21] Appl. No.: 08/916,139

[22] Filed: Aug. 21, 1997

[51] Int. Cl.$^6$ ....................................................... H03L 7/06
[52] U.S. Cl. ............................ 327/156; 327/163; 455/210; 455/260
[58] Field of Search ...................................... 327/156, 159, 327/162, 163; 375/375, 376; 455/182.2, 192.2, 208–210, 258–260, 264, 265

[56] References Cited

U.S. PATENT DOCUMENTS 5,446,418   8/1995   Lin et al. ...................................... 331/11

*Primary Examiner*—Kenneth B. Wells
*Attorney, Agent, or Firm*—Merchant, Gould, Smith, Edell, Welter & Schmidt

[57] ABSTRACT

A relay-race FLL/PLL high-speed timing acquisition device according to the invention comprises a transition detector, a voltage controlled oscillator, a loop filter of PLL, a first lowpass filter, a 90° phase shifter, a second lowpass filter, and a plurality of multipliers. In addition, this relay-race FLL/PLL high-speed timing acquisition device is characterized by further comprising a frequency delimiter which includes a highpass filter coupled to a first circuit, a second circuit coupled to the highpass filter, a third lowpass filter coupled to the second circuit, a Schmitt inverter coupled to the third lowpass filter, and a switch member coupled to the Schmitt inverter. The relay-race FLL/PLL high-speed timing acquisition device can obtain stable and high speed timing acquisition by means of the frequency delimiter.

10 Claims, 7 Drawing Sheets

RELAY-RACE FLL/PLL HIGH-SPEED TIMING ACQUISITION DEVICE

BACKGROUND OF THE INVENTION

1. Field of the Invention

The invention relates to a relay-race FLL/PLL high-speed timing acquisition device, and in particular to a relay-race FLL/PLL high-speed timing acquisition device having a frequency delimiter.

2. Description of the Prior Art

Referring to FIG. 1, there is shown a non-independent continuous dual FLL/PLL high-speed timing acquisition device 1 according to the prior art. This non-independent continuous dual FLL/PLL high-speed timing acquisition device 1 comprises a voltage controlled oscillator 10, a phase detector 11, a frequency detector 12, a first loop filter 13, a second loop filter 14 and an adder 15. Since there is an interaction between a PLL L1 consisting of the phase detector 11, first loop filter 13 and voltage controlled oscillator 10, and a FLL L2 consisting of the frequency detector 12, second loop filter 14 and voltage controlled oscillator 10, it is difficult to optimize the timing acquisition and phase-locking processes. Therefore, a disadvantage of the conventional FLL/PLL high-speed timing acquisition device is requiring longer time for timing acquisition. Furthermore, the stability of this conventional FLL/PLL device may be poor because of the interaction between the FLL and PLL. In general, the above-mentioned loops (that is, FLL and PLL) needs dedicated circuits to implement the FLL and PLL, respectively.

Now, referring to FIG. 2, a conventional reference-clock-based FLL/PLL high-speed timing acquisition device is shown. This conventional FLL/PLL device comprises a voltage controlled oscillator 20, a phase detector 21, a frequency detector 22, a first loop filter 23 and a second loop filter 24, wherein the CLKref is generated by a common quartz oscillator. Before the PLL-based timing recovery system operates the frequency of the voltage controlled oscillator is adjusted into a PLL capture range by the FLL. In order to decrease the interaction between the FLL and PLL, two identical voltage controlled oscillators may be employed such that the FLL will not be affected by the PLL. However, the FLL still affects the PLL tracking process. Similarly, the above-mentioned loops (that is, FLL and PLL) needs dedicated circuits to implement the FLL and PLL, respectively.

To avoid the interaction between the FLL and PLL, a frequency delimiter FLL/PLL device 3 according to the prior art is shown in FIG. 3a. This frequency delimiter FLL/PLL device 3 comprises a voltage controlled oscillator 30, a phase detector 31, a frequency delimiter 32, a first loop filter (a phase-locked loop filter)33, a second loop filter (a frequency-locked loop filter) 34 and an adder 35. In the frequency delimiter FLL/PLL device 3, there is a bandpass filter used to cut off the FLL subsystem. Therefore, the timing acquisition system is only dominated by the PLL in the final tuning process. In practice, since an abrupt stop-band turn is impossible in a low-order bandpass filter, the timing recovery system merely dominated by the PLL cannot avoid the interaction of the FLL and PLL. Therefore, there is an obscure region between the operation bands of the FLL and PLL. As shown in FIG. 3b, there is a guard-band region Bg preferably existing between the frequency delimiter and the capture range of the PLL to avoid the interaction between the FLL and PLL. However, this guard-band region will increase acquisition time. Moreover, dedicated circuits are also needed to realize the FLL and PLL, respectively.

Referring to FIG. 4a, there is shown another conventional FLL/PLL device 4. This conventional FLL/PLL device 4 comprises a first circuit 41, a delimiter 42, a loop filter 43 of PLL, a first lowpass filter 44, a voltage controlled oscillator 45, multiplier 46, 47, and 48, and a transition detector 49. The above-mentioned first circuit 41 comprises a second lowpass filter and a phase shifter connected to the second lowpass filter. The product of the output signal from the delimiter 42 located on the upper arm and the output signal from the first lowpass filter 44 can be used to detect the frequency difference between an input signal r(t) and local oscillator signal. When the frequency difference between the input signal frequency $f_i$ and the local oscillator frequency $f_o$ is less than a predetermined frequency threshold value $F_{th}$, the upper circuit of the conventional FLL/PLL device 4 is turned off. At this point, this conventional FLL/PLL device 4 functions as a PLL circuit. In the FLL/PLL device 4, an automatic frequency control and phase-locking function are completely separated to allow the signal acquisition range and closed-loop bandwidth parameters to be independently established. Therefore, the interaction between the FLL and PLL can be eliminated to enhance the timing acquisition range. However, there is an inherent disadvantage. That is, there exists two stable equilibrium points $P_1$ and $P_2$ at 90° and 270°. As a result, in a coherent digital communication system, if the carrier recovery circuit is phase-locked at 270°, the detected data will be inverted. Therefore, an indicator or corrector has to be equipped to invert the inverted digital signal.

SUMMARY OF THE INVENTION

In view of the above, a major object of the invention is to provide a stable relay-race FLL/PLL high-speed timing acquisition device.

A further object of the invention is to provide a relay-race FLL/PLL high-speed timing acquisition device for automatically and continuously adjusting frequency.

A still further object of the invention is to provide a relay-race FLL/PLL high-speed timing acquisition device consisting of less circuit components.

To achieve these objects, the relay-race FLL/PLL high-speed timing acquisition device according to the invention comprises a transition detector, a voltage controlled oscillator, a phase-locked loop filter, a first lowpass filter, a 90° phase shifter, a second lowpass filter and a plurality of multipliers. This FLL/PLL high-speed timing acquisition device is characterized by further comprising a frequency delimiter which includes a highpass filter coupled to a first circuit, a second circuit coupled to the highpass filter, a third lowpass filter coupled to the second circuit, a Schmitt inverter coupled to the third lowpass filter, and a switch coupled to the Schmitt inverter. Based on the invention, the FLL/PLL device mentioned above can obtain stable and high-speed timing acquisition.

BRIEF DESCRIPTION OF THE DRAWINGS

The invention will become fully understood from the detailed description given hereinbelow and the accompanying drawings which are given by way of illustration only, and thus are not limitative of the present invention, and wherein:

FIG. 3b is a graph showing the relationships between voltage and frequency difference, and between voltage and phase difference of FIG. 3a;

FIG. 4b is a graph showing an output waveform when output frequency is equal to input frequency in FIG. 4a;

FIG. 5b is a characteristic curve graph showing the relationships between voltage and frequency difference, and between voltage and phase difference of FIG. 5a.

DETAILED DESCRIPTION OF THE INVENTION

Figure 5A:
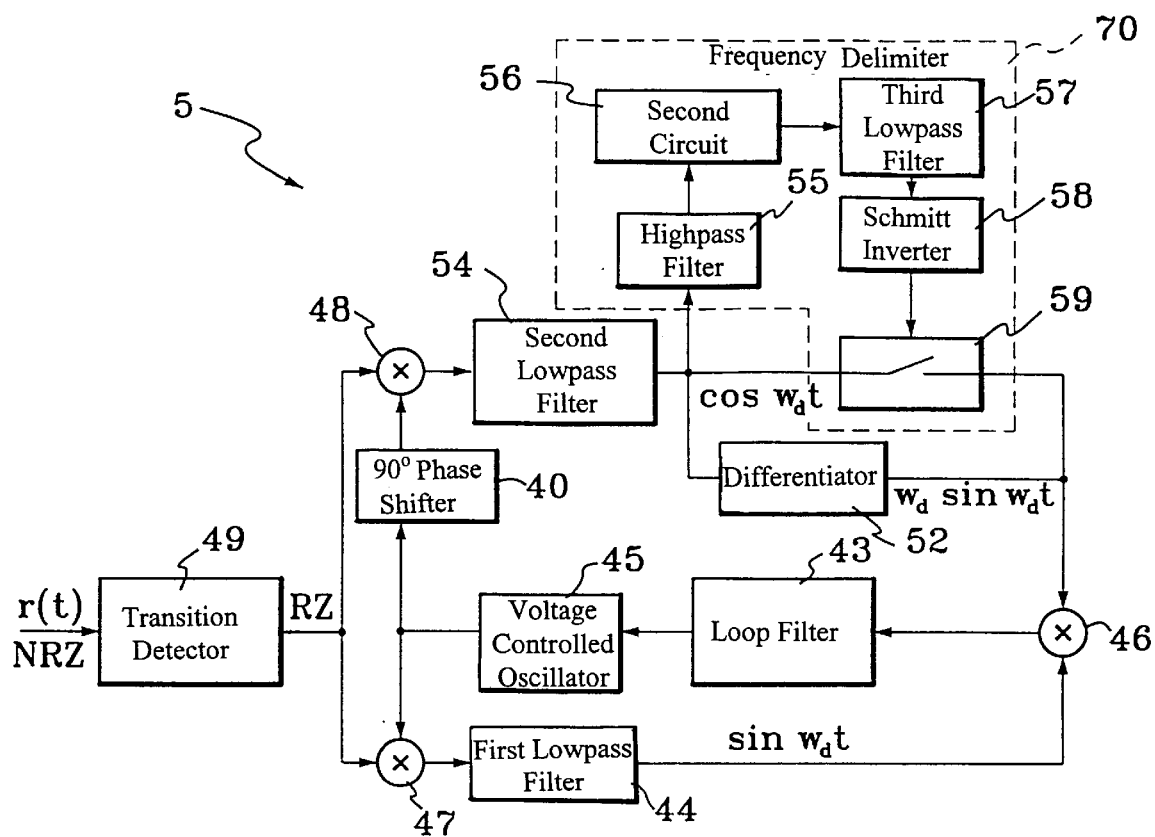
FIG. 5a is a block diagram illustrating a relay-race FLL/PLL high-speed timing acquisition device according to a first embodiment of the invention.

The components in the two embodiments of the invention which are the same as those in the prior are designated with the same reference numerals. Referring to FIG. 5a, there is shown a relay-race FLL/PLL high-speed timing acquisition device 5 according to the invention. This relay-race FLL/PLL device comprises a voltage controlled oscillator 45, a 90° phase shifter 40, a differentiator 52, a loop filter 43, a first lowpass filter 44, a second lowpass filter 54, three multipliers 46, 47, and 48, a highpass filter 55, a second circuit 56, a third lowpass filter 57, a Schmitt inverter 58, a switch 59 and a transition detector 49, wherein the second circuit 56 comprises a full-wave rectifier and a peek voltage detector. This above-mentioned device can be used as a frequency-locked loop or Costas frequency-locked loop. The frequency delimiter 70 comprising the highpass filter 55, the first circuit 56, the third lowpass filter 57, the Schmitt inverter 58 and the switch 59 does not need a high-order bandpass filter to exactly separate operation bands of the FLL and PLL. When the frequency difference fd between the frequency fi of an input signal NRZ and the frequency fo of the voltage controlled oscillator 45 is outside the range of a predetermined frequency threshold difference $(fd)_{th}$ (that is, from $-f_{th}$ to $f_{th}$), the invented FLL/PLL device serves as a frequency-locked loop for coarse frequency lock-up to trim the frequency of the voltage controlled oscillator into the frequency capture range of PLL, and then is automatically switched to function as a PLL. On the other hand, when the frequency difference fd is inside the range of a predetermined frequency threshold difference $(fd)_{th}$, almost entire components of frequency-locked loop are switched to function as the Costas PLL for fine tuning frequency lock-up.

Figure 5B:
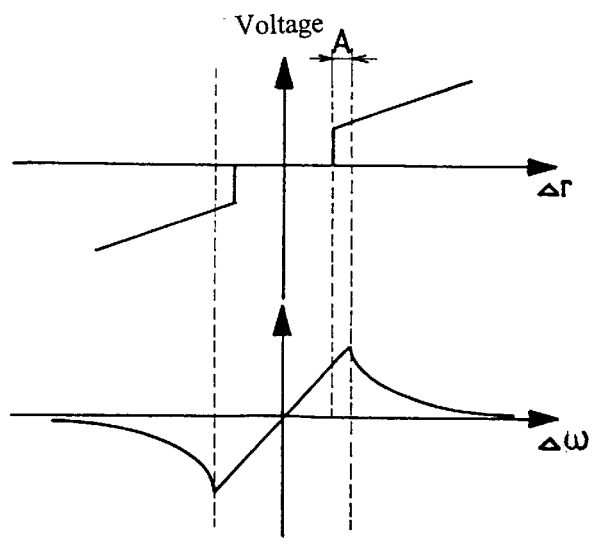

Imaginatively, this FLL/PLL device operates in a manner similar to a relay race and there is no interaction between the FLL and PLL. In addition, since the FLL and PLL will not exist at the same time, there is no interaction between the FLL and PLL. Furthermore, as shown in FIG. 5b, it is allowed to have an overlapped region between the operation bands of the FLL and PLL. Consequently, the fast and stable timing acquisition can be achieved.

Figure 1:
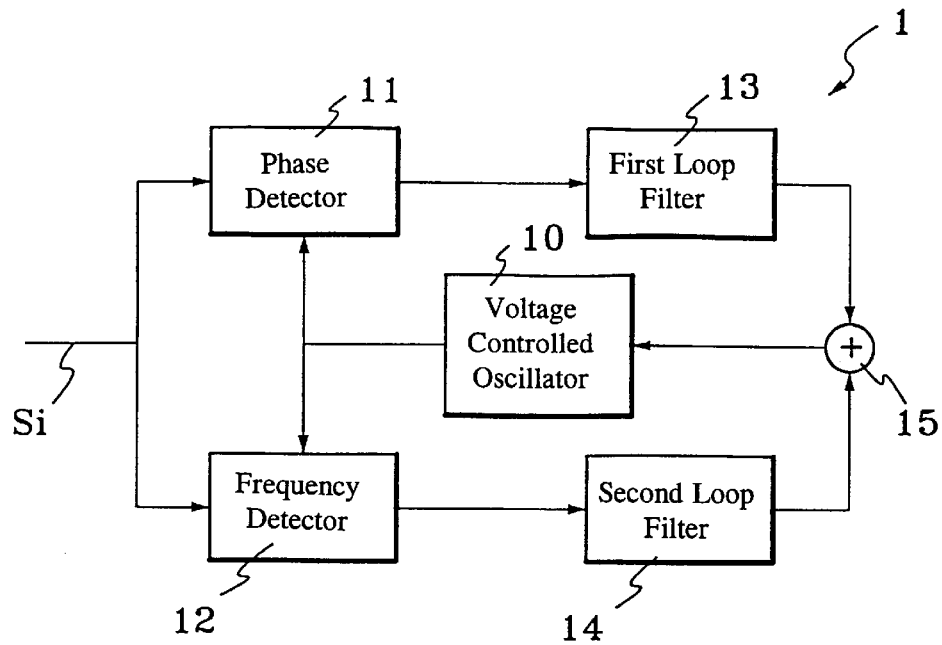
FIG. 1 is a block diagram showing a non-independent continuous dual FLL/PLL device according to the prior art.
Figure 2:
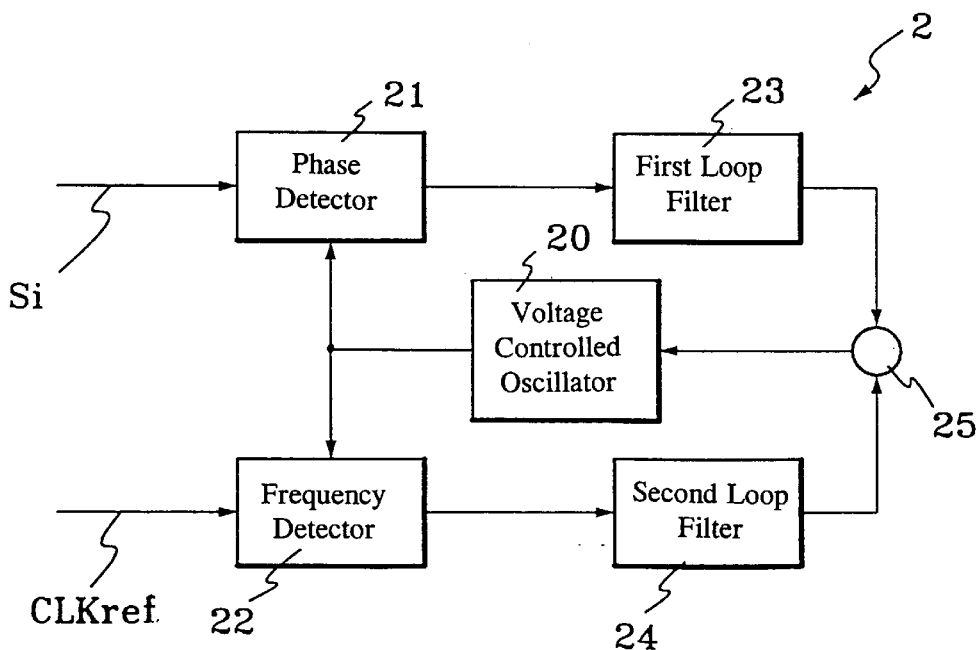
FIG. 2 is a block diagram showing a reference-clock-trimmed non-independent FLL/PLL device according to the prior art.
Figure 3A:
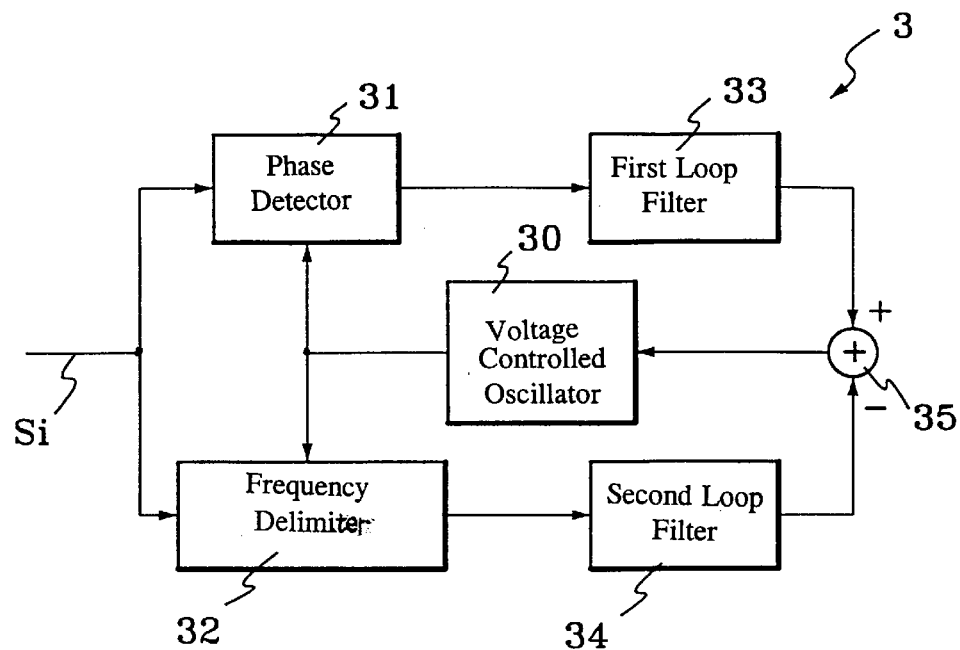
FIG. 3a is a block diagram showing a FLL/PLL device having a frequency delimiter according to the prior art.
Figure 3B:
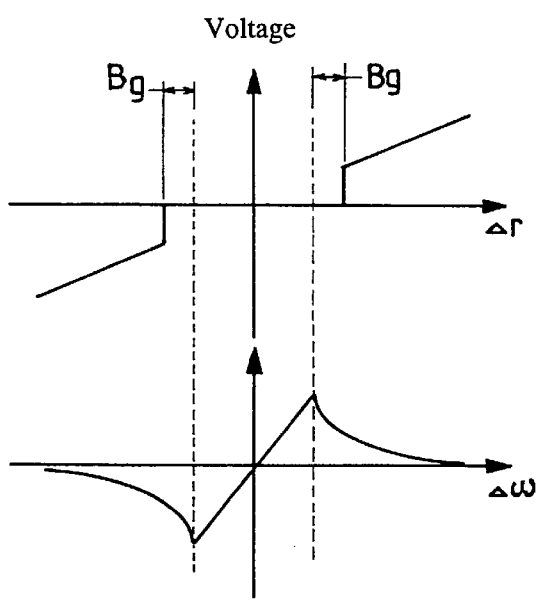
Figure 4A:
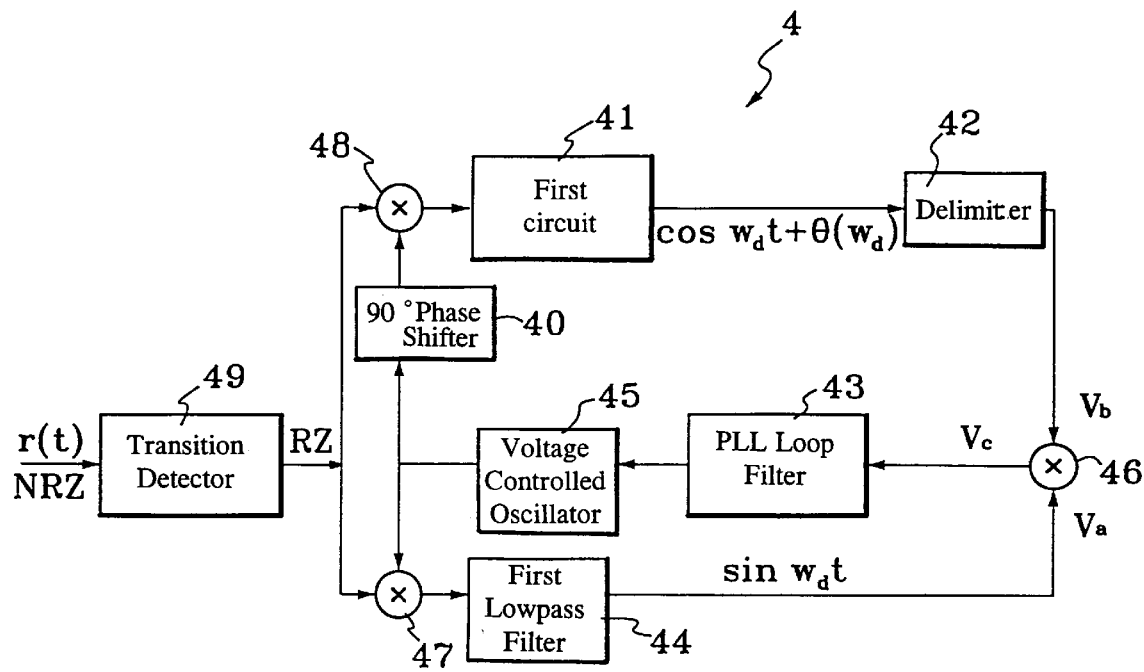
FIG. 4a is a block diagram having an automatic frequency control and phase locking function according to the prior art.
Figure 4B:
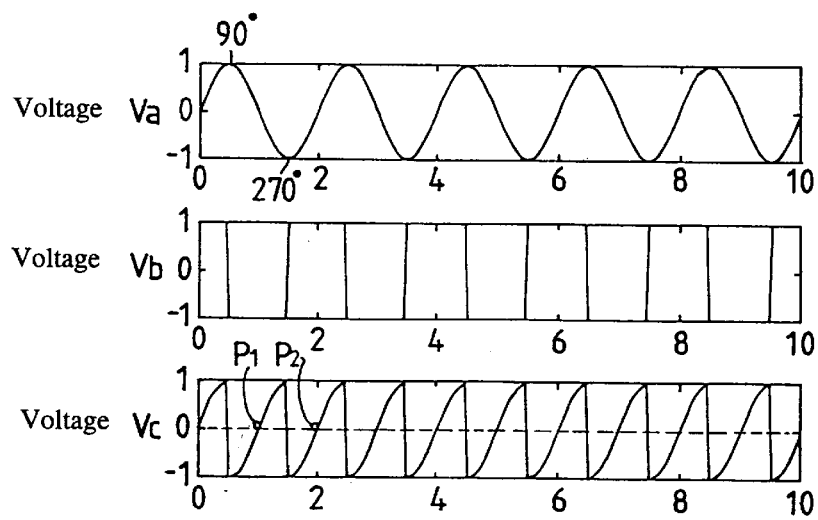
Figure 6A:
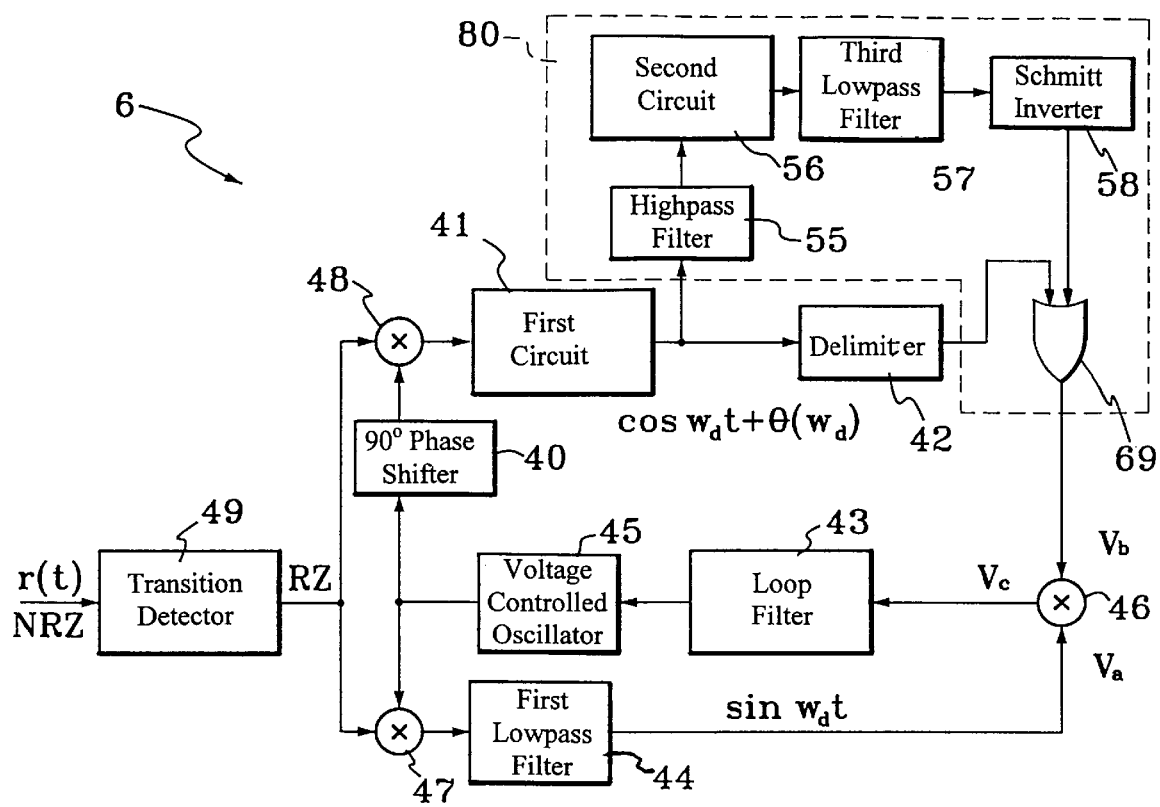
FIG. 6a is a block diagram illustrating a relay-race FLL/PLL high-speed timing acquisition device according to a second embodiment of the invention.
Figure 6B:
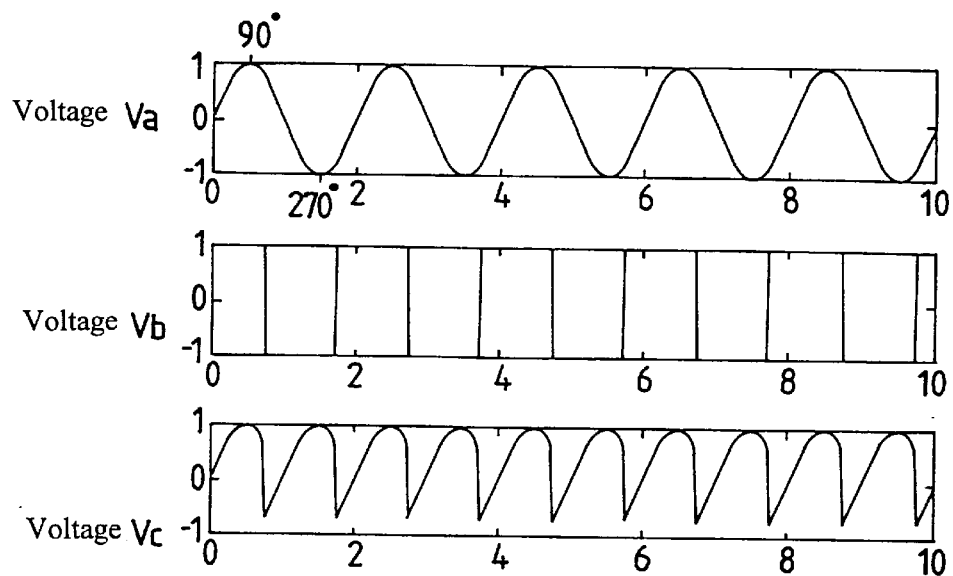
FIGS. 6b–6d are characteristic curve graph showing the relationships between phases and voltages Va, Vb and Vc respectively corresponding to (fi-fo) greater than fth, (fo-fi) greater than fth, fo-fi less than or equal to fth.
Figure 6C:
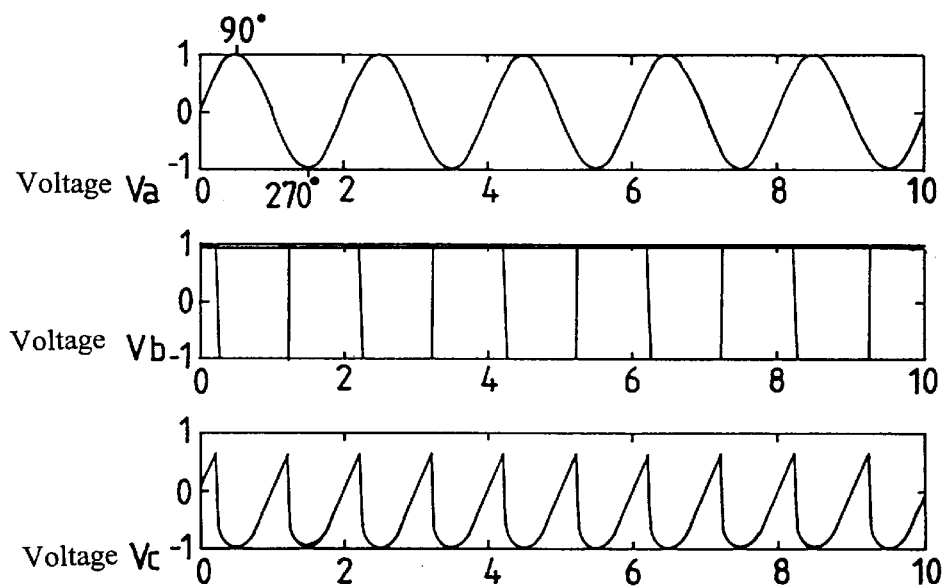
Figure 6D:
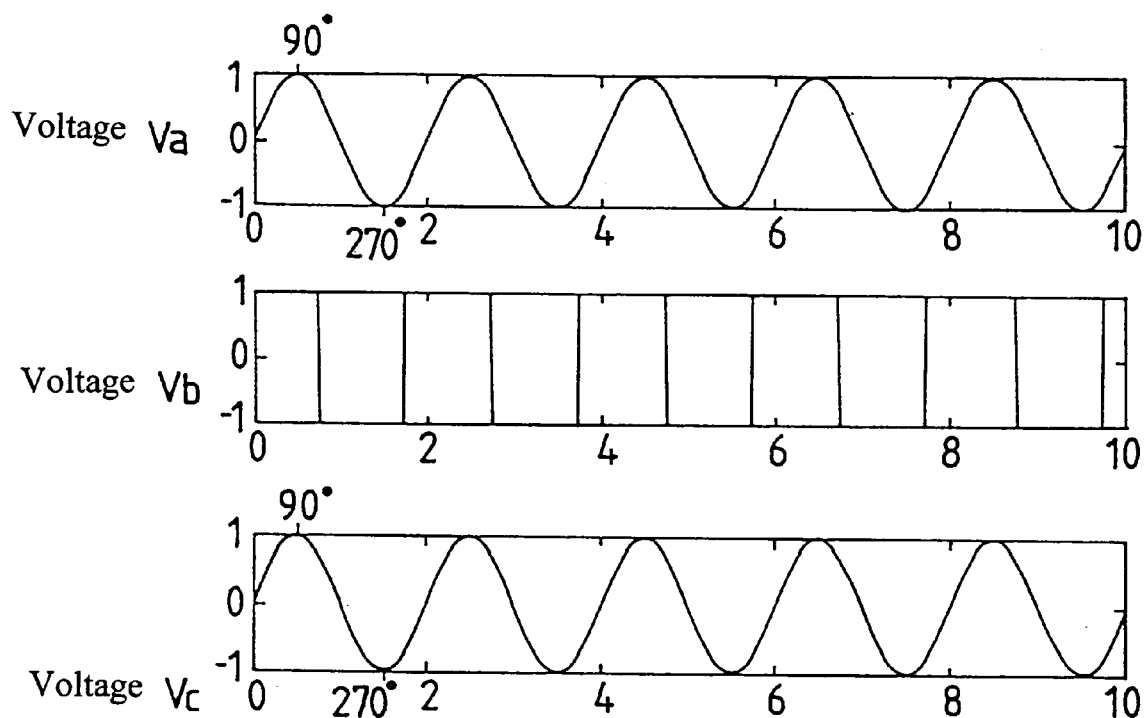

FIG. 6a illustrates a second embodiment of the invention for improving the FLL/PLL high-speed timing acquisition device as shown in FIG. 4a. According to the second embodiment of the invention, the device 6 is the conventional device shown in FIG. 4a, with a frequency delimiter 80 added, wherein the frequency delimiter 80 including a highpass filter 55, a second circuit 56, a third lowpass filter 57, a Schmitt inverter 58 and a logical OR gate 69. The frequency delimiter 80 in the device 6 according to the invention can create a different FLL. As shown in FIGS. 6b–6d, since the device only has a stable equilibrium point at 90°, adverse effects caused by the two stable equilibrium points shown in FIG. 4b can be avoided. Therefore, the device 6 should not invert received digital data.

In summary, the advantages of the invention are described as follows:

(1) Since there is no need to trim frequency, stable and high-speed timing acquisition can be achieved.
(2) In the entire timing acquisition process, there is no interaction between the FLL and PLL.
(3) Since the FLL and PLL will not exist at the same time, it is allowed that the operation bands of the FLL and PLL have an overlapped region.
(4) The FLL and PLL share almost the same circuit components (that is, more circuit components can be saved). Furthermore, no external reference clock and high-order bandpass or highpass filter are required.

What is claimed is:

1. A relay-race FLL/PLL high-speed timing acquisition device comprising a transition detector, a voltage controlled oscillator, a PLL loop filter, a first lowpass filter, a 90° phase shifter, second lowpass filter and a plurality of multipliers; characterized by further comprising a frequency delimiter which comprises:
   a highpass filter coupled to said second lowpass filter;
   a second circuit coupled to said highpass filter;
   a third lowpass filter coupled to said second circuit;
   a Schmitt inverter coupled to said third lowpass filter; and
   a switching member coupled to said Schmitt inverter.

2. The device as claimed in claim 1, further comprising a differentiator coupled between the input of said highpass filter and said switching member.

3. The device as claimed in claim 1, wherein said switching member is a switch.

4. The device as claimed in claim 1, wherein said phase shifter is connected to said second lowpass filter in series.

5. The device as claimed in claim 1, wherein said second circuit includes a full-wave rectifier and a peek-voltage detector.

6. A relay-race FLL/PLL high-speed timing acquisition device comprising a transition detector, a voltage controlled oscillator, a PLL loop filter, a first lowpass filter, a 90° phase shifter, a first circuit and a plurality of multipliers; characterized by further comprising a frequency delimiter which comprises:

a highpass filter coupled to said first circuit;

a second circuit coupled to said highpass filter;

a third lowpass filter coupled to said second circuit;

a Schmitt inverter coupled to said third lowpass filter; and a switching member coupled to said Schmitt inverter.

7. The device as claimed in claim 6, wherein said switching member is a logical OR gate.

8. The device as claimed in claim 7, further comprising a delimiter coupled between said first circuit and said logical OR gate.

9. The device as claimed in claim 6, wherein said phase shifter is connected to said first circuit in series.

10. The device as claimed in claim 6, wherein said second circuit includes a full-wave rectifier and a peak-voltage detector.

* * * * *